(12) United States Patent
Abdo et al.

(10) Patent No.: US 11,984,890 B2
(45) Date of Patent: May 14, 2024

(54) SCALABLE INTERCONNECTED QUANTUM ARCHITECTURE

(71) Applicant: INTERNATIONAL BUSINESS MACHINES CORPORATION, Armonk, NY (US)

(72) Inventors: Baleegh Abdo, Fishkill, NY (US); Jerry M. Chow, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 250 days.

(21) Appl. No.: 17/525,899

(22) Filed: Nov. 13, 2021

(65) Prior Publication Data

US 2023/0155593 A1 May 18, 2023

(51) Int. Cl.
| | | |
|---|---|---|
| H03K 19/195 | (2006.01) | |
| G06N 10/40 | (2022.01) | |
| H01P 1/38 | (2006.01) | |
| H01P 7/08 | (2006.01) | |
| H10N 60/12 | (2023.01) | |

(52) U.S. Cl.
CPC ........... *H03K 19/195* (2013.01); *G06N 10/40* (2022.01); *H01P 1/38* (2013.01); *H01P 7/082* (2013.01); *H10N 60/12* (2023.02)

(58) Field of Classification Search
CPC ...... H03K 19/195; G06N 10/00; G06N 10/20; G06N 10/40
See application file for complete search history.

(56) References Cited

U.S. PATENT DOCUMENTS

| | | | |
|---|---|---|---|
| 9,454,061 B1 | 9/2016 | Abdo et al. | |
| 9,589,236 B1 | 3/2017 | Abdo | |
| 9,680,452 B1* | 6/2017 | Abdo | G06N 10/00 |
| 9,735,776 B1 | 8/2017 | Abdo et al. | |
| 9,787,278 B1 | 10/2017 | Abdo | |
| 9,806,711 B1* | 10/2017 | Abdo | G06N 10/00 |
| 9,818,064 B1 | 11/2017 | Abdo | |
| 9,870,536 B1 | 1/2018 | Abdo | |
| 9,922,289 B2 | 3/2018 | Abdo | |
| 10,164,724 B2 | 12/2018 | Abdo | |
| 10,230,038 B2 | 3/2019 | Abdo | |
| 10,320,331 B1* | 6/2019 | Abdo | H10N 60/12 |
| 10,374,612 B1* | 8/2019 | Sinclair | H01L 29/127 |

(Continued)

FOREIGN PATENT DOCUMENTS

WO    2020212092 A1    10/2020

OTHER PUBLICATIONS

Adbo, B. et al., "High-Fidelity Qubit Readout using Interferometric Directional Josephson Devices"; arXiv:2006.01918v2 [quant-ph] (2021); 32 pgs.

(Continued)

*Primary Examiner* — Patrick O Neill
(74) *Attorney, Agent, or Firm* — Intelletek Law Group, PLLC; Gabriel Daniel, Esq.

(57) ABSTRACT

A quantum circuit includes a quantum signal unit. There is a first quantum chip comprising a plurality of qubit devices and bi-directionally coupled to the quantum signal unit. A first quantum entangling unit is bi-directionally coupled to the quantum signal unit and configured to generate an entanglement between a first and a second qubit device on the first quantum chip via the quantum signal unit.

20 Claims, 11 Drawing Sheets

(56) References Cited

U.S. PATENT DOCUMENTS

| | | | |
|---|---|---|---|
| 10,398,031 | B2 | 8/2019 | Abdo et al. |
| 10,817,463 | B1 | 10/2020 | Debenedictis |
| 2012/0319684 | A1 | 12/2012 | Gambetta et al. |
| 2014/0314419 | A1 | 10/2014 | Paik |
| 2016/0267032 | A1 | 9/2016 | Rigetti et al. |
| 2016/0308502 | A1 | 10/2016 | Abdo et al. |
| 2017/0227795 | A1 | 8/2017 | Bishop et al. |
| 2018/0003753 | A1 | 1/2018 | Bishop et al. |
| 2020/0394353 | A1 | 12/2020 | Delaney et al. |
| 2020/0401927 | A1 | 12/2020 | Nickerson et al. |

OTHER PUBLICATIONS

Adbo, B. et al., "Multi-Path Interferometric Josephson Directional Amplifier for Qubit Readout"; Quantum Science and Technology (2018); vol. 3, 17 pgs.
Adbo, B. et al., "Nondegenerate Three-Wave Mixing with the Josephson Ring Modulator"; Physical Review (2013); vol. B 87; 18 pgs.
Abdo, B. et al., "Full Coherent Frequency Conversion between Two Propagating Microwave Modes"; Physical Review Letters (2013); vol. 110; 5 pgs.
Abdo, B. et al., "Josephson Directional Amplifier for Quantum Measurement of Superconducting Circuits"; Physical Review Letters (2014); vol. 112; 5 pgs.
Abdo, B. et al., "Active Protection of a Superconducting Qubit with an Interferometric Josephson Isolator"; Nature Communications (2019); vol. 3154; 10 pgs.
Andrews, R.W. et al., "Bidirectional and Effcient Conversion Between Microwave and Optical Light"; Nature Physics (2014); vol. 10; pp. 321-326.
Bochmann, J. et al., "Nanomechanical Coupling Between Microwave and Optical Photons"; Nature Physics (2013); vol. 9; pp. 712-716.
Brecht, T. et al., "Demonstration of Superconducting Micromachined Cavities"; Appl. Phys. Lett. (2015); vol. 107; 5 pgs.
Brecht, T. et al., "Multilayer Microwave Integrated Quantum Circuits for Scalable Quantum Computing"; Quantum Information (2016); vol. 2; 4 pgs.
Chapman, B. J. et al., "General Purpose Multiplexing Device for Cryogenic Microwave Systems"; Appl. Phys. Lett. (2016); vol. 108; 6 pgs.
Chen, Y-F., et al. "Microwave Photon Counter Based on Josephson Junctions"; Physical Review Letters (2011); vol. 107; 5 pgs.
Fan, B. et al., "Nonabsorbing High-Efficiency Counter for Itinerant Microwave Photons"; Physical Review (2014); vol. B 90; 5 pgs.
Govia, L. et al., "High-Fidelity Qubit Measurement with a Microwave-Photon Counter"; Physical Review (2014); vol. 90; 12 pgs.
Grimsmo, A. L. et al., "Quantum Metamaterial for Broadband Detection of Single Microwave Photons"; Physical Review Applied (2021); vol. 15; 13 pgs.
Gröblacher, S. et al., "Demonstration of an Ultracold Microoptomechanical Oscillator in a Cryogenic Cavity"; Nature Physics (2009); vol. 5; pp. 485-488.
Lei, C. U., et al., "High Coherence Superconducting Microwave Cavities with Indium Bump Bonding"; Appl. Phys. Lett. (2020); vol. 116; 6 pgs.
Lecocq, F. et al., "Nonreciprocal Microwave Signal Processing with a Field-Programmable Josephson Amplifier"; Physical Review Applied (2017); vol. 7; 17 pgs.
Lecocq, F. et al., et al., "Control and Readout of a Superconducting Qubit using a Photonic Link"; Nature (2021); vol. 591; 14 pgs.
Macklin, C. et al., "A Near-Quantum-Limited Josephson Traveling-Wave Parametric Amplifier"; Science (2015); vol. 350:6258, pp. 307-310.
Magnard, P. et al., "Microwave Quantum Link between Superconducting Circuits Housed in Spatially Separated Cryogenic Systems"; Physical Review Letters (2020); vol. 125; 7 pgs.
Naaman, O. et al., "On-chip Josephson Junction Microwave Switch"; Appl. Phys. Lett. (2016); vol. 108; 5 pgs.
Pechal, M. et al., "Superconducting Switch for Fast On-Chip Routing of Quantum Microwave Fields"; Physical Review Applied (2016); vol. 6; 8 pgs.
Reagor, M. et al., "Quantum Memory with Millisecond Coherence in Circuit QED"; Physical Review (2016); vol. B 94; 8 pgs.
Romero, G. et al., "Microwave Photon Detector in Circuit QED"; Physical Review Letters (2009); vol. 102 ; 4 pgs.
Rosenthal, E. et al., "Breaking Lorentz Reciprocity with Frequency Conversion and Delay"; Physical Review Letters (2017); vol. 119; 5 pgs.
Sathyamoorthy, S. R. et al., "Quantum Nondemolition Detection of a Propagating Microwave Photon"; Physical Review Letters (2014); vol. 112; 5 pgs.
Sliwa, K. M. et al., "Reconfigurable Josephson Circulator/Directional Amplifier"; Physical Review X (2015); vol. 5; 10 pgs.

* cited by examiner

SCALABLE INTERCONNECTED QUANTUM ARCHITECTURE

BACKGROUND

Technical Field

The present disclosure generally relates to superconducting devices, and more particularly, to qubit control that supports a scalable and modular quantum processor.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

Superconducting quantum computing architectures are configured to either support a centralized quantum processor that runs a local-like error-correction code, such as the surface code, or a modular architecture that relies on entangling small remote quantum nodes and runs a distributed-like error correction code such as the cat code. Superconducting quantum computers are generally assembled by hand (e.g., put together by off the shelf components that are compatible in a cryogenic environment) as the base-temperature stage of a dilution refrigerator, which is a time consuming and labor-intensive process to harmonize the disparate components. Such approach typically introduces a large hardware overhead at the bottom of the dilution refrigerator, thereby limiting the scalability of the quantum computers (e.g., to hundreds of qubits). Further, the large hardware overhead can overwhelm the cooling power of the dilution refrigerator.

SUMMARY

According to one embodiment, a quantum circuit includes a quantum signal unit. A first quantum chip having a plurality of qubit devices is (e.g., bi-directionally) coupled to the quantum signal unit. A first quantum entangling unit is (e.g., bi-directionally) coupled to the quantum signal unit and configured to generate an entanglement between a first and a second qubit device on the first quantum chip via the quantum signal unit.

In one embodiment, a second quantum chip including a plurality of qubit devices is (e.g., bi-directionally) coupled to the quantum signal routing unit. The quantum entanglement unit is configured to generate an entanglement between the first qubit device on the first quantum chip and a third qubit device on the second quantum chip, via the quantum signal routing unit.

In one embodiment, the first qubit device and the second qubit device of the first quantum chip are not coupled directly.

In one embodiment, the first quantum entangling unit includes a Josephson mixer device.

In one embodiment, the first quantum entangling unit includes a beam splitter device.

In one embodiment, the first quantum entangling unit includes a superconducting transmission line.

In one embodiment, the entangling unit is on a same substrate as the quantum chip.

In one embodiment, a second quantum signal unit is (e.g., bi-directionally) coupled to the quantum chip.

In one embodiment, there is a long-range input-output (I/O) port. A short-range I/O port is coupled to the entangling unit.

In one embodiment, the first quantum chip, the quantum entangling unit, and the quantum signal unit are separate components on a printed circuit board (PCB).

In one embodiment, a second quantum chip is (e.g., bi-directionally) coupled between the first quantum signal unit and the second quantum signal unit.

In one embodiment, the first quantum chip is in a first cryogenic refrigeration unit and the second quantum chip is in a second cryogenic refrigeration unit that is separate from the first cryogenic refrigeration unit.

According to one embodiment, a quantum circuit includes a quantum signal unit. A first quantum chip includes a plurality of qubit devices and is (e.g., bi-directionally) coupled to the quantum signal unit. A second quantum chip is (e.g., bi-directionally) coupled to the first quantum signal unit. A first quantum entangling unit is (e.g., bi-directionally) coupled to the quantum signal unit and configured to generate an entanglement between a first and a second qubit device on the first quantum chip via the quantum signal unit. A synthesizer unit is (e.g., bi-directionally) coupled to the first quantum chip, the second quantum chip, and the first quantum signal unit. A classical processing unit (e.g., bi-directionally) coupled to the synthesizer unit and operative to control the first and second quantum chips.

In one embodiment, the second quantum chip, the synthesizer unit, first quantum signal unit, and the first quantum entangling unit are on a same printed circuit board (PCB).

In one embodiment, the PCB is vertically anchored in a cryogenic refrigeration unit. The classical processing unit is in a stage of the cryogenic refrigeration unit that is at a higher temperature than the first and second quantum chips.

In one embodiment, a first auxiliary port is coupled to the first quantum signal unit. An amplification or detection unit is coupled to an output of the first quantum signal unit. A second auxiliary port is coupled to the amplification or detection unit.

In one embodiment, the quantum entangling unit is configured to generate an entanglement between a first and a second qubit device on the first quantum chip.

In one embodiment, the quantum entangling unit is configured to generate an entanglement between a third qubit device on the first quantum chip and a fourth qubit device on the second quantum chip.

In one embodiment, the first qubit device and the second qubit device of the first quantum chip are not directly coupled.

By virtue of the teachings herein, a more scalable quantum computing architecture is provided while reducing the energy cost associated with cooling the components of the quantum computer in a refrigeration unit. The reduction in the number of physical components and intermediate components provides a less lossy and noisy environment for the electronic components to operate, thereby providing more reliable output signals and interaction with qubits. In one aspect, traditional isolators and magnetic shielding of the quantum processor is not necessary.

Integrating the quantum processor, quantum memory, entangling unit, amplification unit, and the I/O components into the same board or chip enhances the efficiency of the various operations, decreases the delay times, reduces losses, reflections, and distortions of the signals, and minimizes the total size and volume of the quantum processor at the base-temperature stage.

In architectures where a board is used (e.g., motherboard or printed circuit board (PCB)), it significantly reduces the hardware overhead at the base-temperature stage of the dilution refrigeration and enhances the performance of the quantum computer. A motherboard can support a modular quantum computing architecture in which two or more quantum chips can be entangled on the same board or on two separate boards and enable them to work in consortium. A motherboard also enables long-range quantum communication between quantum processors located in different dilution refrigerators. The motherboard would support quantum processors that include, for example, thousands of physical qubits.

Incorporating an entangling capability increases the qubit connectivity in the quantum processor (by connecting distant neighbors). Consequently, the quantum volume of the quantum computer is enhanced.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
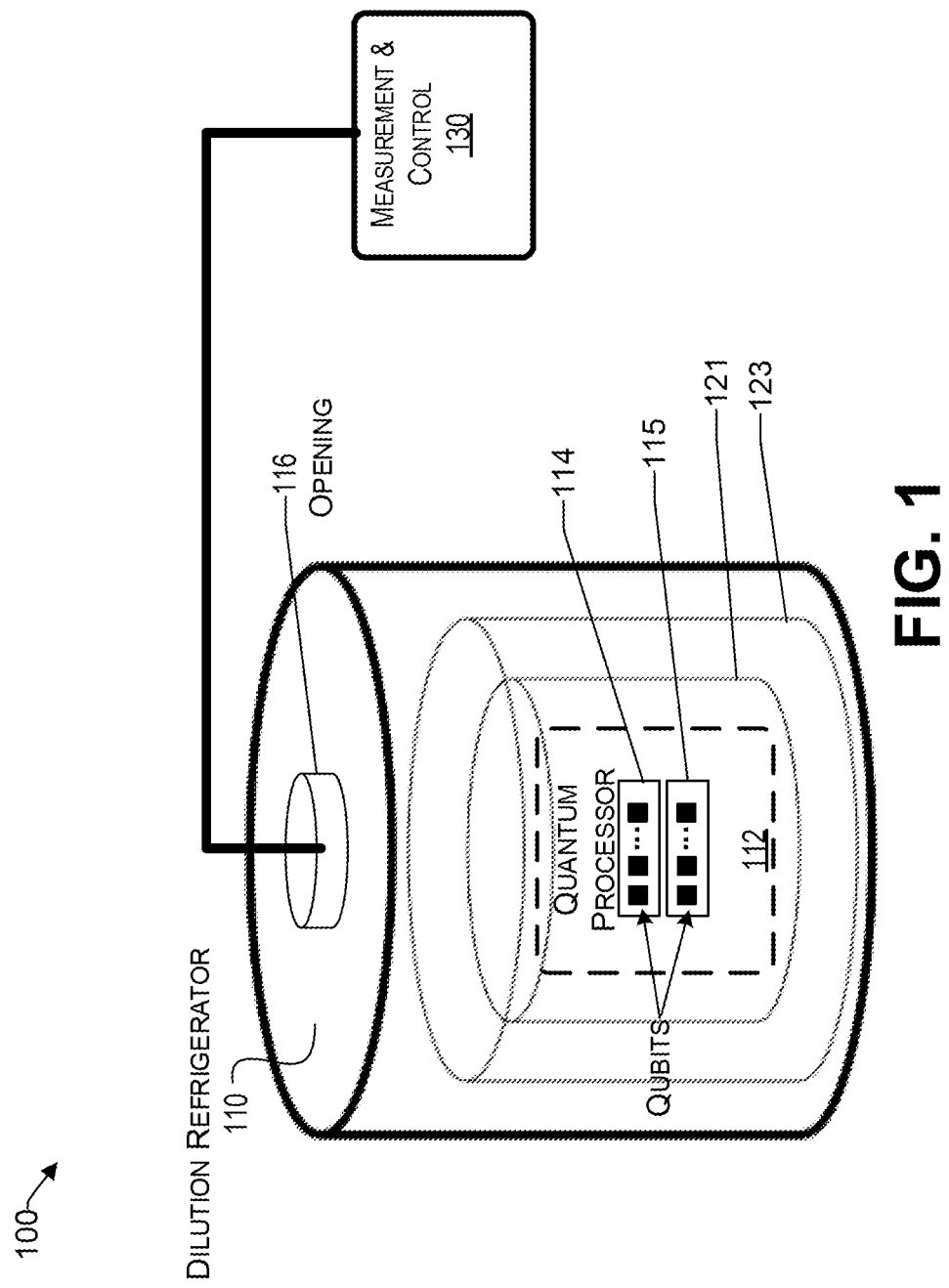
FIG. 1 illustrates an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the superposition of qubit states or entanglement of two qubits.

A quantum processor (Q-processor) uses the unintuitive nature of entangled qubit devices (compactly referred to herein as "qubit," or plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the ON and OFF states (equivalent to 1 and 0 in binary code), a quantum processor harnesses these quantum states of matter to output signals that are usable in data computing.

As used herein, the term flux-tunable relates to a device whose frequency depends on magnetic flux. A driveline relates to a qubit control line that carries signals to the qubit. The term multiplexing includes the meaning of a single control line capable of carrying signals for multiple qubits.

As used herein, an SFQ, sometimes referred to as a rapid single flux quantum (RSFQ), or its energy efficient variant ERSFQ, is a digital electronic device that uses superconducting devices, namely Josephson Junctions, to process digital signals. A Josephson junction (JJ) is a quantum mechanical device that is made of two superconducting electrodes separated by a barrier. A Josephson Transmission Line (JTL) is a connector that is operative to transfer quantum information. A Feeding Josephson Transmission Line (FJTL) is a transmission line operative to provide a voltage on the bias line that is at least equal the voltage at the bias injection points.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to superconducting devices, and more particularly, to a scalable interconnected quantum architecture. The electromagnetic energy associated with a qubit state can be contained in the qubit architecture, which can include Josephson junctions, as well as capacitive and inductive elements. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle two or more qubits. Much of the process may be performed in a cold environment (e.g., in a cryogenic chamber), while the microwave signal of a qubit may ultimately be measured at room temperature, discussed in more detail later.

The amplitude and/or phase of the returned/output microwave signal carries information about the qubit state, such as whether the qubit is in the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers (e.g., Josephson parametric amplifiers (JPA)) and Josephson travelling-wave parametric amplifiers (JTWPAs), may be used as preamplifiers (i.e., first amplification stage) at the output of the quantum system to boost the quantum signal and improve the signal to noise ratio of the output chain, while adding the minimum amount of noise as dictated by quantum mechanics. In addition to Josephson amplifiers, such as Josephson parametric amplifiers (JPAs), Josephson Directional amplifiers (JDAs), Josephson parametric converters (JPCs), and Josephson travelling-wave parametric amplifiers (JTWPAs), that can be used in scalable quantum processor, there are microwave components that use Josephson mixers, such as Josephson circulators, and Josephson isolator (JIS) devices.

A qubit system may include one or more readout resonators coupled to the qubit. A readout resonator may be a transmission line with a finite length that includes a capacitive connection to an external feedline on one side and is either shorted to the ground on the other side, such as for a quarter wavelength resonator, or may have a capacitive connection to ground, such as for a half wavelength resonator, which results in oscillations within the transmission line, with the resonant frequency of the oscillations being detuned from the frequency of the qubit. For example, the qubit state can affect a pulse coming from the control/measurement instruments at the readout resonator frequency and transmitted through or reflected off the readout resonator. The pulse can act as a measurement of the qubit.

Between qubits there may be a coupling resonator, sometimes referred to herein as a coupler resonator or RIP bus, which allows coupling different qubits together in order to realize quantum logic gates, sometimes referred to herein as entanglement. The coupling resonator is typically structurally similar to the readout resonator. However, more complex designs are possible. When a qubit is implemented as a transmon, each side of the coupling resonator may be coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator (e.g., RIP bus). In this way, there can be mutual interdependence in the state between coupled qubits, thereby allowing to use the state of one qubit to control the state of another qubit. As used herein the term entanglement refers to when an interaction between two qubits is such that the states of the two cannot be specified independently, but can only be specified for the whole system. In this way, the states of two qubits are linked together.

The ability to include more qubits is salient to being able to realize the potential of quantum computers. Generally, performance increases as temperature is lowered, for example by reducing the residual thermally-excited state qubit population and decreasing the thermal broadening of the qubit transition frequencies. The lower the temperature, the better for a quantum processor. Accordingly, some or all of the components discussed in the figures herein may be operated in a cryogenic environment.

The inventors have recognized that to increase the computational power and reliability of a quantum computer, improvements are along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In one aspect, the teachings herein are based on Inventors' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits and providing a scalable and modular quantum processor architecture that can support thousands or millions of superconducting physical qubits.

Example Architecture

FIG. 1 illustrates an example architecture 100 of a quantum computing system, consistent with an illustrative embodiment. The architecture 100 may include a quantum processor 112 comprising one or more chips 114, 115. Each chip (e.g., 114, 115) can include a plurality of qubits. The quantum processor 112 is located in a refrigeration unit 110, which may be a dilution refrigerator. A dilution refrigerator is a cryogenic device that provides continuous cooling to temperatures typically 10 mK on its bottom temperature stage 121 (that houses the quantum processor 112). Some support circuitry may located be at a higher temperature stage 123, which may be at 4K.

In one embodiment, the dilution refrigerator 110 may comprise several stages/plates that have different temperature, for example 300 K at the top of the fridge (room temperature), the others 40 K, 4 K, 0.7K, 0.1K, and 0.01 K are inside the fridge in vacuum. There are electromagnetic/ metallic shields that are attached to the different temperature stages. These shields with vacuum gap in between enclose each other. The inner shield is attached to the base-stage. The most outer shield is attached to the 300 K stage.

Most of the physical volume of the architecture 100 is due to the large size of the refrigeration unit 110. To reach the near-absolute zero temperatures at which the system operates, the refrigeration unit 110 may use liquid helium as a coolant or helium pulse tube.

There is a measurement and control unit 130 that is outside of the refrigeration unit 110. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. A practical challenge in known refrigeration devices that house qubits chips 114 and/or 115 is that the number of qubits that can be accommodated in the refrigeration unit 110 is limited by various factors, including the number of wires between the measurement and control unit 130 and the qubits 114 measured/controlled thereby.

Accordingly, in one aspect, what is provided herein is an architecture that can reduce the number of lines between a measurement and control unit 130 and a quantum processor 112 that is housed in a dilution refrigerator 110. In various embodiments, two qubits that are on the same chip and/or on separate chips can be entangled via a resonant structure.

Example Block Diagrams

Figure 2:
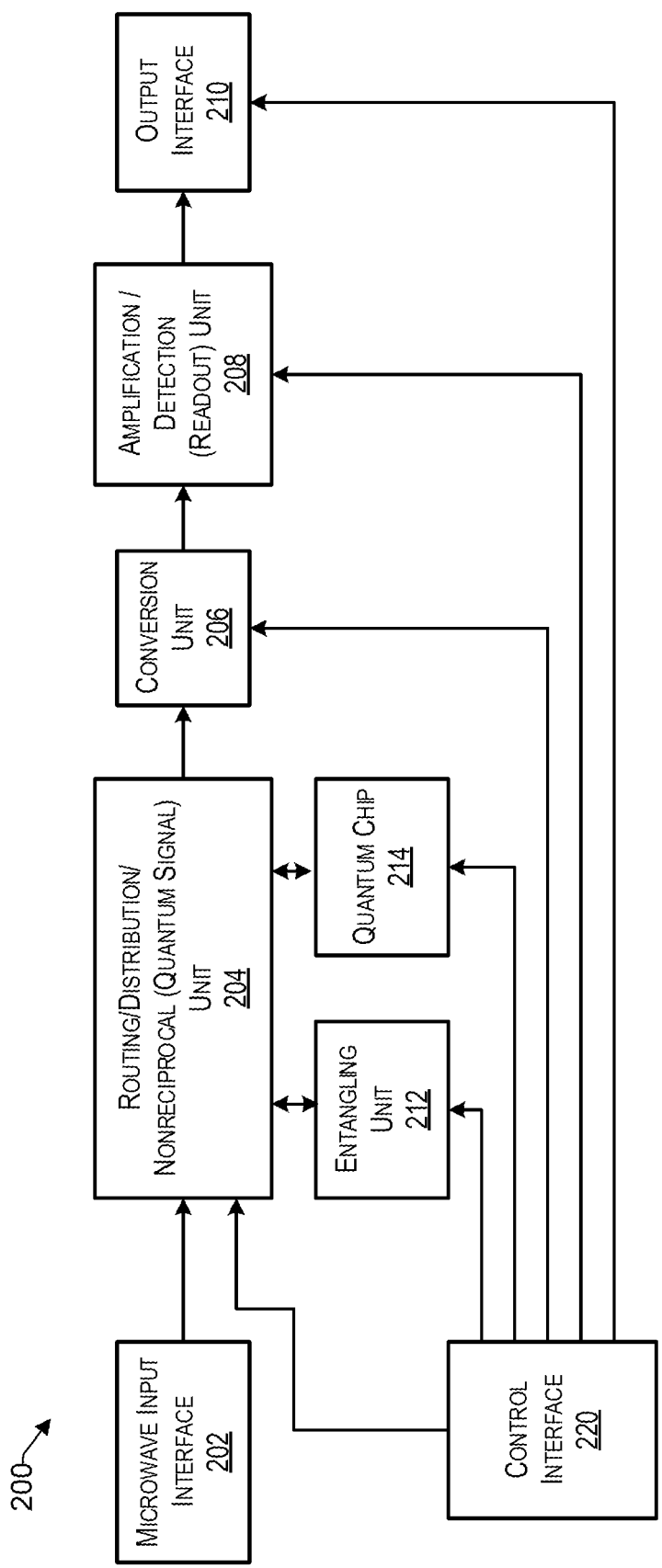
FIG. 2 is a conceptual block diagram of a hybrid architecture that supports local and remote entanglement in a quantum processor, consistent with an illustrative embodiment.

Reference now is made to FIG. 2, which is a conceptual block diagram of a hybrid architecture 200 that supports local and remote entanglement in a quantum processor, consistent with an illustrative embodiment. The hybrid architecture 200 includes a quantum chip 214 comprising a plurality of qubits. The quantum chip 214 may be (e.g., bi-directionally) coupled to a quantum signal (i.e., routing) unit 204. A quantum entangling unit 212 is (e.g., bi-directionally) coupled to the quantum signal routing unit 204. The lines with double arrows indicate a bidirectional signal flow, while unidirectional arrows indicate unidirectional signal flow between respective components. The quantum entangling unit 212 is configured to generate an entanglement between a first and a second qubit device of the first quantum chip 214 via the quantum signal unit 204. In various embodiments, the entanglement may be between adjacent qubits or qubits that are far away (e.g., not adjacent and without an immediate coupler in between).

The quantum signal unit 204 is operative to route microwave signals between the different components of the architecture 200. For example, the quantum signal unit receives microwave signals from the input interface 202 and routes them between the quantum chip 214 and the conversion unit 206. In various embodiments, the components 202 to 220 of the architecture 200 can be on the same chip or distributed on two or more chips of a common motherboard. For example, the quantum signal unit 204 can (1) route the input signals from the input ports to the quantum processor, (2) route output signals from the quantum processor to an output line for classical sampling and processing, (3) route quantum signals from the quantum processor to a memory (or in reverse), (4) route entangling signals between qubits on the same quantum chip or different quantum chips (on the same board or different boards), (5) route quantum information from the quantum processor to the outside world and vice versa through the microwave-optical link, and/or (6) isolate a quantum processor against excess noise coming from the output chain or from the amplification/detection unit.

In various embodiments, the quantum signal unit 204 may comprise one or more of the following components: (1) nonreciprocal devices such as Josephson isolators and Josephson circulators, (2) on-chip low-loss microwave switches, (3) lossless signal combiners/distributors based on superconducting filters, (4) microwave hybrids, (5) power dividers, (6) and/or directional couplers.

There may be a microwave input interface 202 coupled to the quantum signal unit 204. For example, the input interface 202 can support microwave signals (e.g., 1 to 20 GHz) that carry qubit pulses, quantum-gate signals, and readout signals. There may be a conversion unit 206 coupled to an output of the quantum signal unit 204. The conversion unit 206 can be configured to perform lossless frequency conversion (up-conversion or down-conversion) of the input and/or output microwave signals to match certain desired frequencies, to avoid frequency crowding on the input, and/or output transmission lines. In one aspect, the conversion unit 206 protects against electromagnetic noise in certain band of frequencies, to enable design flexibility, by using microwave devices, such as low-noise high-electron-mobility-transistor (HEMT) amplifiers, optimized for working in different frequency bands, thereby allowing frequency-division multiplexing. The conversion unit 206 is able to standardize the frequencies of the input and output signals, which do not necessarily match those of the quantum chips. In one embodiment, a Josephson parametric converter (JPC) operated in frequency conversion mode without photon gain can be used to implement the conversion unit 206.

The amplification/detection unit 208, sometimes referred to herein as the readout unit, may be configured to enable and facilitate fast, high-fidelity qubit readout. In various embodiments, this readout can be performed by (i) amplifying the readout signal carrying the qubit information without adding more noise than required by quantum mechanics to the processed signal. This can be done, for example, by using a QLA to amplify the readout signal, or (ii) Detecting or counting the readout photons leaving the readout resonator, which encode the qubit state.

In one embodiment (i.e., (i)), the readout unit 208 may include quantum-limited amplifiers (QLAs), such as Josephson parametric converters (JPCs), Josephson directional amplifiers (JDAs), JTWPAs, Josephson parametric amplifiers (JPAs). In another embodiment (i.e., (ii)), the readout unit 208 may include single microwave photon detectors or photon counters. The output of this readout unit 208 may be sent to the designated electronic equipment that controls the quantum processor and is responsible for measuring it, whether it is located outside the fridge as part of the measurement and control unit 130 or inside the dilution refrigerator 110 of FIG. 1, at the 4 K stage.

In various embodiments, the entangling unit 212 may be operative to generate on-demand remote entanglement between qubits on the same chip that are not directly coupled (e.g., qubits that are located in the perimeter of the chip to increase connectivity), between qubits on different quantum chips integrated into the same board, or between qubits on quantum chips that reside on different boards in the same fridge. For example, the entangling unit 212 includes superconducting devices that can be used to generate or facilitate remote entanglement, such as Josephson mixers, Josephson parametric converters, Josephson multipliers, Josephson circulators, single-photon-generators, generators of two-mode squeezing, single-photon detectors, beam-splitters (hybrids), and/or superconducting transmission lines.

In one embodiment, the quantum chip 214 may be a multilayer stack comprising dielectric substrates (such as, without limitation, silicon or sapphire), superconducting traces and circuits, superconducting through silicon vias (TSVs), superconducting qubits, superconducting buses, superconducting readout resonators, Josephson devices, superconducting bumps, superconducting ground planes, etc. Other examples of qubits that can be part of the quantum chip are spin qubits and quantum dots.

The control interface 220 may be coupled to and operative to control the quantum signal unit 204, conversion unit 206, readout unit 208, output interface 210, entangling unit 212, as well as the quantum chip. The control interface 220 can support microwave (1-20 GHz) and/or direct current (DC) signals. These signals may include microwave pumps for operating Josephson devices, such as Josephson mixers, quantum-limited amplifiers (QLAs), Josephson directional amplifiers (JDA), Josephson traveling-wave parametric amplifiers (JTWPA), microwave photon detectors and/or photon counters, Josephson isolator (JIS) devices, Josephson circulators, switches, and/or drives for parametric gates. The DC signals may include signals for flux biasing tunable couplers, tunable qubits, and various Josephson devices.

In one embodiment, the output interface 210 can support microwave signals (1-20 GHz) and/or DC signals (such as DC voltages). The output ports carry output signals to room-temperature electronics controlling the quantum processor or to RSFQ or cryogenic CMOS logic controlling the quantum processor mounted at a higher temperature stage inside the dilution fridge, such as the 4 K stage.

Figure 3:
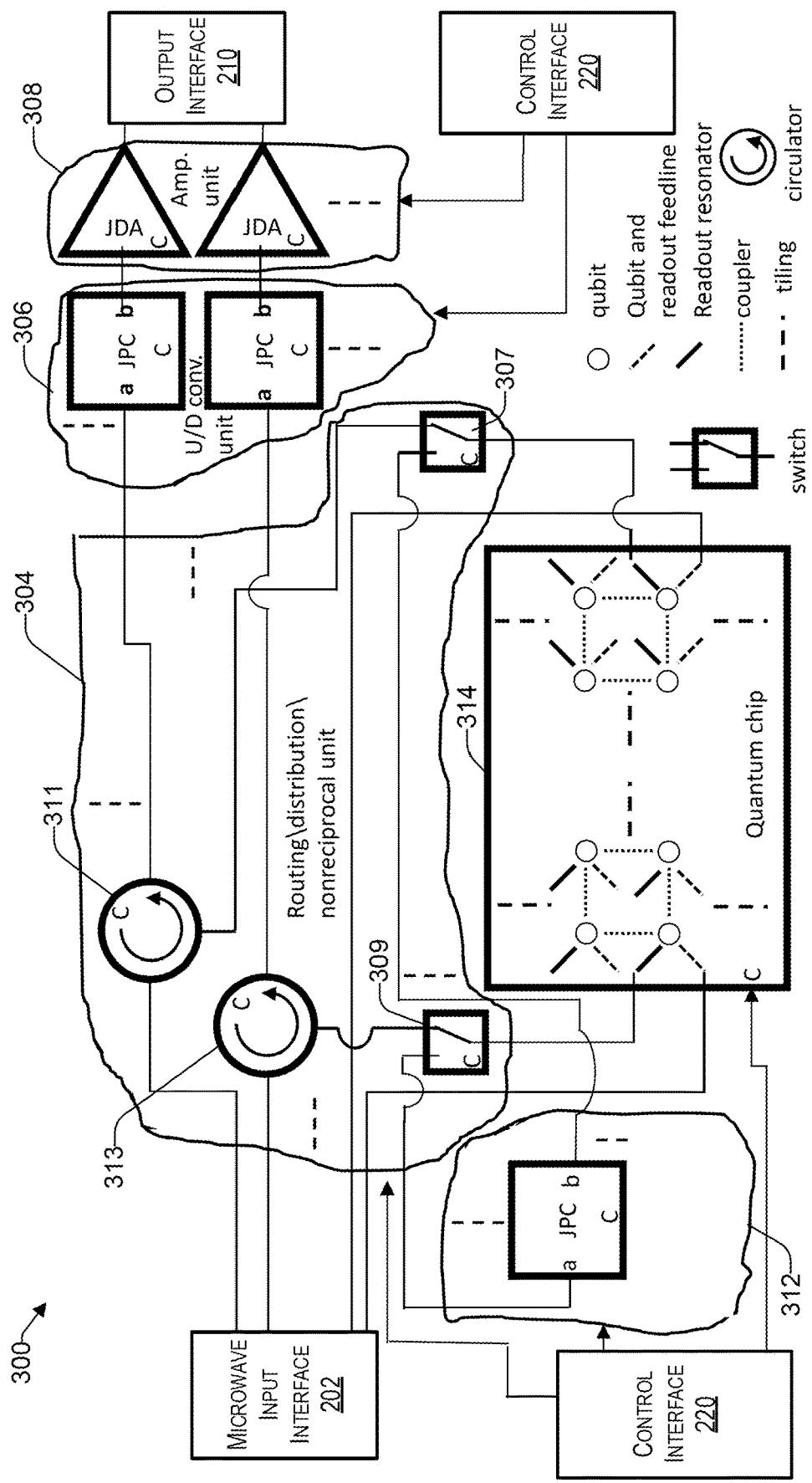
FIG. 3 provides a more detailed block diagram of a hybrid architecture that supports local and remote entanglement in a quantum processor, consistent with an illustrative embodiment.

Reference now is made to FIG. 3, which provides a more detailed block diagram of a hybrid architecture 300 that supports local and remote entanglement in a quantum processor, consistent with an illustrative embodiment. Many of the components of FIG. 3 were discussed in the context of the discussion of FIG. 2 and therefore not repeated here for brevity. FIG. 3 illustrates that the quantum signal unit 304, which is coupled between the input interface 202 and the conversion unit 306, may include Josephson circulators 311 and 313, and switches 307 and 309, as well as superconducting transmission lines. For example, the switches 307 and 309 allow the entangling unit 312 to access and entangle qubits at different physical locations on the quantum chip 314 (e.g., qubits are non-adjacent). In one embodiment, the switches 307 and 309 control the flow of quantum information between the entangling unit 312 and the quantum chip 314, or between the microwave input/output interface 202/210 and the quantum chip 314.

In the example of FIG. 3, the conversion unit 306 comprises of an array of Josephson parametric converters (JPCs) operated in frequency conversion mode without photon gain. The readout unit 308 comprises of an array of Josephson directional amplifiers (JDAs) and is configured to receive the output signals of the conversion unit 206. The entangling unit 312 includes one or more Josephson parametric converters that are (e.g., bi-directionally) coupled to the quantum signal routing unit 304.

Figure 4:
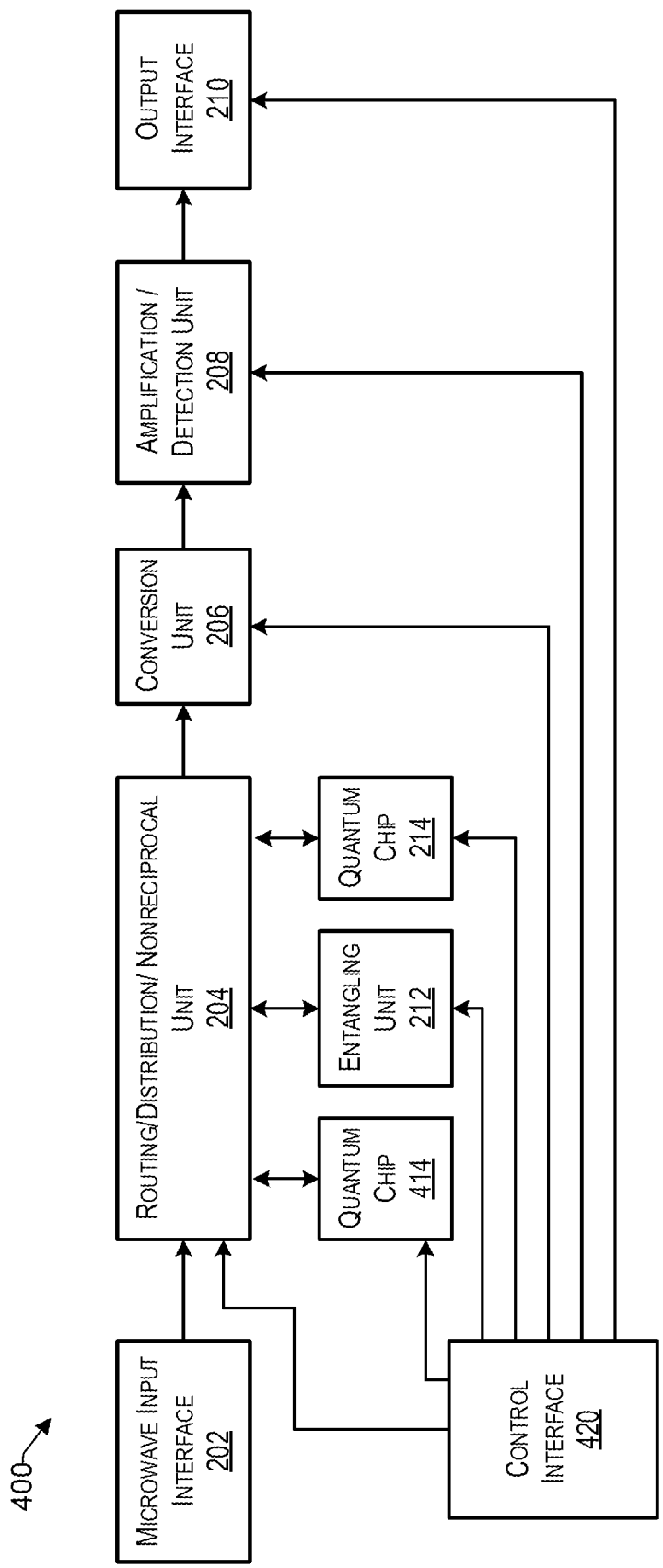
FIG. 4 is a conceptual block diagram of a hybrid architecture that supports local and remote entanglement in a quantum processor comprising a plurality of quantum chips, consistent with an illustrative embodiment.

The teachings herein are not limited to a single quantum chip, but can be extended to multiple chips. In this regard, reference is made to FIG. 4, which is a conceptual block diagram of a hybrid architecture 400 that supports local and remote entanglement in a quantum processor comprising a plurality of quantum chips, consistent with an illustrative embodiment. For example, architecture 400 may represent a multi-core quantum processor that, in different embodiments, may be on a single printed circuit board or on more than one printed circuit board. Many of the components of FIG. 4 were discussed in the context of the discussion of FIG. 2 and therefore not repeated here for brevity. The salient difference is that, in addition to a first quantum chip 214, architecture 400 supports a second quantum chip. Accordingly, control interface 420 is operative to control the quantum signal unit 204, the conversion unit 206, the readout unit 208, the output interface 210, the entangling unit 212, the first quantum chip 214, as well as the second quantum chip 414. The entangling unit 212 may be operative to support local (i.e., on the same module) and remote entanglement (i.e., separate module).

Figure 5:
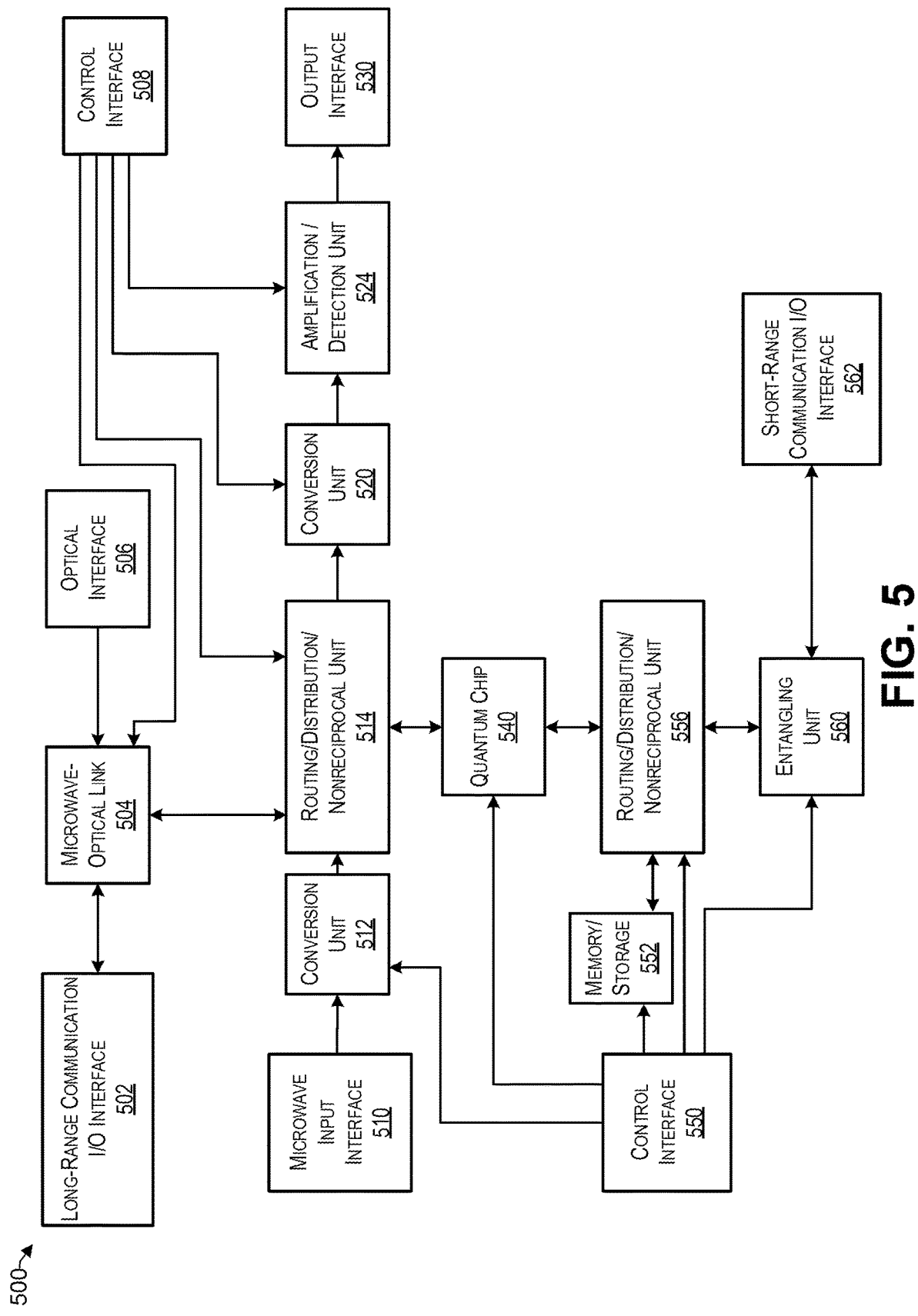
FIG. 5 is a conceptual block diagram of a hybrid architecture that supports local and remote entanglement in a quantum processor and is interconnected with other processors inside and outside a refrigeration unit, consistent with an illustrative embodiment.

FIG. 5 is a conceptual block diagram of a hybrid architecture 500 that supports local and remote entanglement in a quantum processor and interconnectivity with other processors inside and outside a refrigeration unit, consistent with an illustrative embodiment. For example, the communication (e.g., generation of the entanglement) between the boards can be performed through short-range and long-range communication interfaces 562 and 502, respectively. There may be a first quantum signal unit 514 that is coupled between a first conversion unit 512 dedicated to the input path, and a second conversion unit 520 dedicated to the output path. Accordingly, unlike the architecture 200 discussed in the context of FIG. 2, there are two separate conversion units 512 and 520 dedicated to the input path and the output path, respectively, thereby facilitating lossless frequency conversion of input and output signals. There may be a (e.g., microwave) input interface 510 coupled to the first conversion unit 512. An amplification/detection (e.g., readout) unit 524 may be coupled to the output of the conversion unit 520. There may be an output interface 530 coupled to an output of the amplification/detection unit 524.

There is an optical interface 506 coupled to a microwave optical link 504. In one embodiment, the optical interface 506 supports and carries optical control signals, such as (without limitation) lasers, acting as drives, that facilitate the frequency conversion process. The microwave optical link 504 may be configured to transduce quantum information in a reciprocal manner between microwave and optical carrier frequencies. In various embodiments, the optical link 504 can establish long-range quantum communication between two distant quantum processors located inside two different fridges or between hybrid quantum platforms that use, for example, ions and superconducting qubits. Optical frequencies are appropriate for long-range communications due to the ultra-low loss of optical fibers per unit length and because photons in the optical domain are more energetic than the blackbody radiation noise of the environment at room temperature. By way of non-limiting example, nano-mechanical devices and piezo-electric materials can be used to implement the optical link 504.

There is a long-range communication input-output (I/O) interface 502 bi-directionally coupled to the microwave optical link 504. For example, the long-range communication I/O interface 502 may facilitate connections between motherboards located inside different dilution refrigerators. Such interface/port is configured to transmit and/or receive optical signals that generate remote entanglement between distant quantum chips.

The first control interface 508 is operative to control the amplification/detection unit 524, conversion unit 520, quantum signal unit 514, and optical link 504. The operation and components of an example control interface were discussed in the context of the architecture of FIG. 2 and therefore not repeated here for brevity.

There is a second quantum signal unit 556 configured to perform the function similar to that of the first quantum signal unit 514. In one embodiment, a single quantum unit is used to perform the functions of the first and second quantum signal units 514 and 556. There may be a long-term memory/storage unit 552 coupled to the second quantum signal unit 556. The memory/storage unit 552 is operative to store quantum information and retrieve on demand from a trigger of the control interface 550 and/or the quantum signal unit 556. For example, the memory/storage unit 552 can be implemented using high-Q superconducting cavities, high-Q mechanical systems, or long-lived qubits, such as ions or spins.

The quantum entangling unit 560 is bi-directionally coupled to the second quantum signal routing unit 556. The quantum entangling unit 560 is capable of generating an entanglement between a first and a second qubit device of the quantum chip 540 via the quantum signal unit 556. In various embodiments, the entanglement may be between adjacent qubits or qubits that are far away (e.g., not adjacent and without an immediate coupler in between).

There is a short-range communication I/O interface 562 bi-directionally coupled to the entangling unit 560. For example, the short-range communication I/O interface 562 can be connect between motherboards located inside the same dilution refrigerator. The short-range communication I/O interface 562 may be configured to transmit and receive microwave signals that generate remote entanglement between quantum chips located at different locations inside the fridge. A second control interface 550 may be configured to control the conversion unit of the input path 512, the quantum chip 540, the memory/storage unit 552, the quantum signal unit, and the entangling unit 560.

Figure 6:
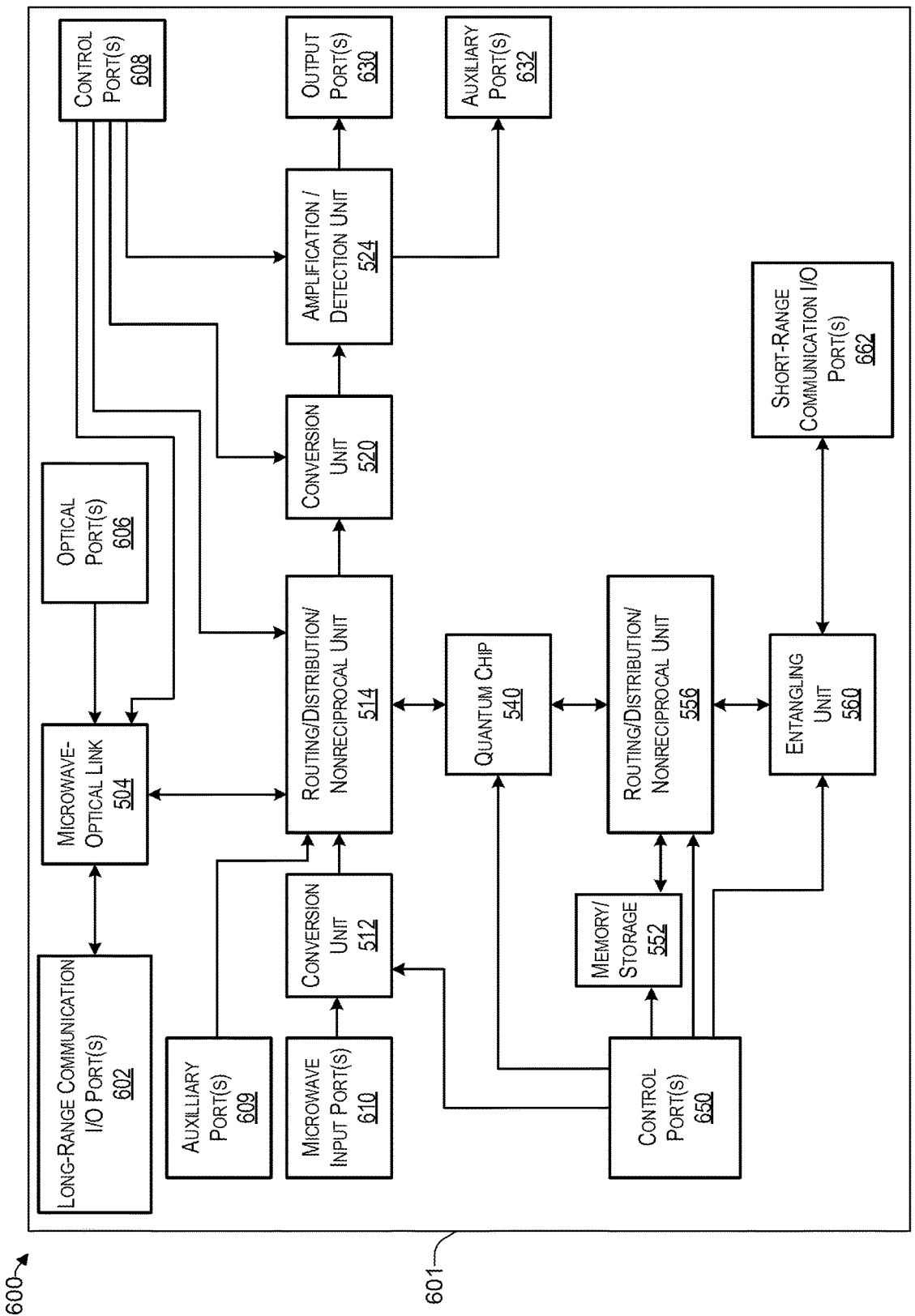
FIG. 6 is a conceptual block diagram of a hybrid architecture that supports local and remote entanglement in a single quantum processor and is interconnected with other processors inside and outside a refrigeration unit, consistent with an illustrative embodiment.

FIG. 6 is a conceptual block diagram of a hybrid architecture 600 that supports local and remote entanglement in a single quantum processor and is interconnected with other processors inside and outside a refrigeration unit, consistent with an illustrative embodiment. Architecture 600 represents an arrangement of components on a (e.g., multi-layer) printed circuit board (PCB) board or a laminate substrate 601. Many of the components of FIG. 6 were discussed in the context of the discussion of FIG. 5 and therefore not repeated here for brevity. Since on a PCB, some of the interfaces discussed in the context of FIG. 5 have been replaced with ports, such as long-range communication I/O port(s) 602, optical port(s) 606, control port(s) 608, output port(s) 630, short-range communication I/O port(s) 662, control port(s) 650, and microwave input port(s) 610, while their functionality is similar to the corresponding interfaces of FIG. 5.

In one embodiment, there are one or more auxiliary ports 609 coupled to the first quantum signal unit 514 and one or more auxiliary ports 632 coupled to the amplification/detection unit 524. The auxiliary ports 609 and 632 are operative to provide heat sinks and thermalization for the PCB (e.g., motherboard) 601, as well as impedance matched terminations for dissipating power off the chip for Josephson devices, such as quantum-limited amplifiers (QLAs), Josephson directional amplifiers (JDAs) and Josephson isolator (JIS) devices.

By way of example and not by way of limitation, a platform, sometimes referred to herein as a board, such as PCB 601, may comprise a multilayer PCB/laminate constructed of superconducting layers and vias, or high-conductivity copper. In some embodiments, it may be constructed of high conductivity copper plated with gold. The various components 602 to 662 can be integrated into one or more boards through bump bonding, wire bonding, or printed on the board. In some embodiments, one or more components are bump bonded to interposer chips that are in turn bump-bonded to the board.

A quantum chip can be integrated inside well-defined pockets in the board 601 or integrated at the surface of the board 601. In one embodiment, a quantum chip 540 is covered or mounted into mechanical oxygen-free high thermal conductivity (OFHC) copper covers or packages that are attached to the board 601.

Buried transmission lines inside the board may connect various chips and devices integrated into the board 601. The transmission lines realized in the multi-conductive layers and grounds in the board 601 can be used for routing signals across the board 601 between chips, such as the quantum chip 540, and components of FIG. 6. In one embodiment, the lines located on different layers do not cross each other. Rather, the lines are surrounded along their paths by ground vias to provide protection against crosstalk. Most of these traces comprise superconducting material or high conductivity normal metals.

In one embodiment, the board 601 could be divided into regions, populated by different components, and anchored at different dilution refrigerator temperature stages. In this embodiment, the conductive traces connecting between the different regions are resistive or superconducting to provide the requisite thermal isolation between the different temperature stages.

Figure 7:
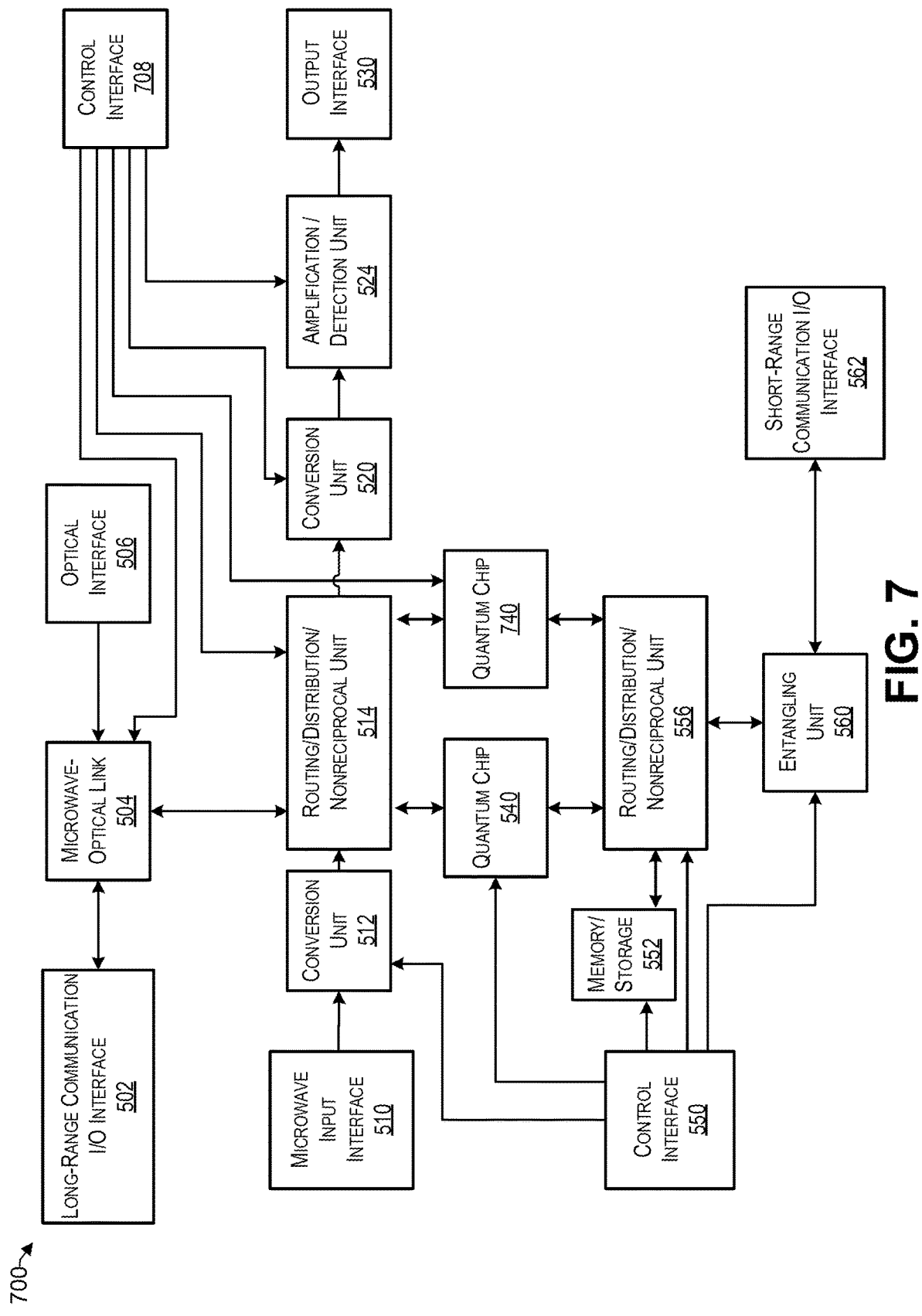
FIG. 7 is a conceptual block diagram of a hybrid architecture that supports local and remote entanglement in a plurality of quantum processors and is interconnected with other processors inside and outside a refrigeration unit, consistent with an illustrative embodiment.

Reference now is made to FIG. 7, which is a conceptual block diagram of a hybrid architecture 700 that supports local and remote entanglement in a plurality of quantum processors and is interconnected with other processors inside and outside a refrigeration unit, consistent with an illustrative embodiment. Many components of the architecture 700 of FIG. 7 were discussed in the context of FIG. 5 and therefore not repeated here for brevity. As illustrated in FIG. 7, a salient difference between the architecture of FIG. 5 is that there is a second quantum chip 740 bidirectionally coupled to the first quantum signal unit 514 and the second quantum signal unit 556. In one embodiment, the second quantum chip is controlled by a control interface (e.g., 708) that is different than the control interface (e.g., 550) of the first quantum chip 540. By virtue of the architecture 700 of FIG. 7, a multi-processor qubit processor can be accommodated for entanglement that are in a common refrigeration unit.

Figure 8:
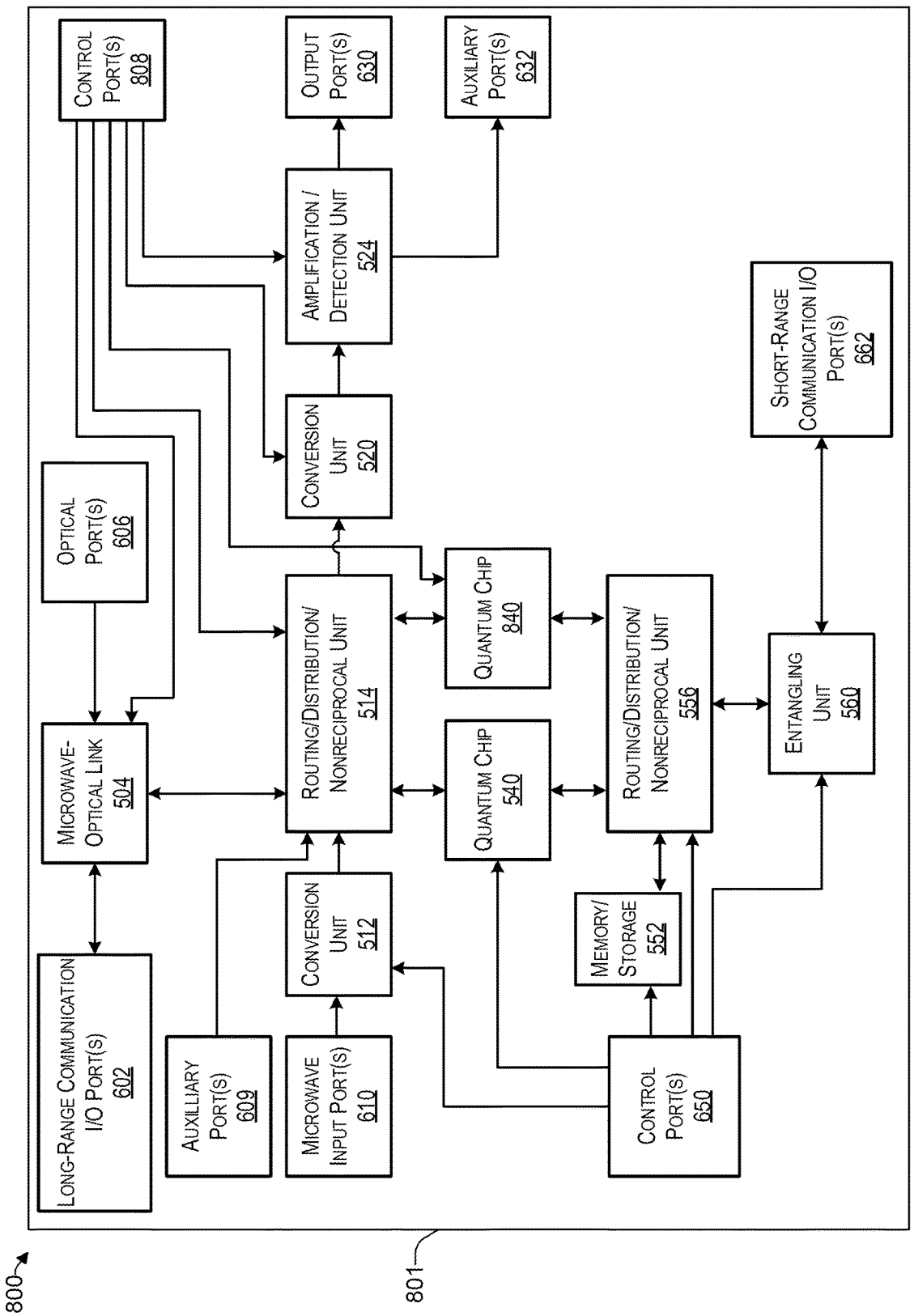
FIG. 8 is a conceptual block diagram of a hybrid architecture that supports local and remote entanglement in a multi quantum processor that is interconnected with other processors inside and outside a refrigeration unit on a multilayer platform, consistent with an illustrative embodiment.

FIG. 8 is a conceptual block diagram of a hybrid architecture 800 that supports local and remote entanglement in a multi quantum processor that is interconnected with other processors inside and outside a refrigeration unit on a multilayer platform, consistent with an illustrative embodiment. Architecture 600 represents an arrangement of components on a platform such as (e.g., multi-layer) printed circuit board (PCB) board or a laminate substrate 801. Many of the components of FIG. 8 were discussed in the context of the discussion of FIGS. 5 and 6, and therefore not repeated here for brevity. In addition to being on a multilayer platform 801, a salient difference in architecture 800 is that includes a second quantum chip 840 in addition to the first quantum chip 540. Accordingly, control port(s) 808 is operative to control the amplification/detection unit 524, conversion unit 520, quantum signal unit 514, microwave optical link 504, as well as the second quantum chip 840.

In some embodiments, there is a classical processing unit inside the dilution refrigerator. In this regard, reference is made to FIG. 9, which is a conceptual block diagram of a quantum architecture 900 with embedded classical processing and control, consistent with an illustrative embodiment. Some of the components of the quantum architecture 900 are similar to those of FIGS. 5 and 7, and therefore not repeated here for brevity. There is a (e.g., signal/waveform) synthesizer unit 960 bidirectionally coupled to a first quantum chip 540 and a second quantum chip 740. The synthesizer unit may be operative to generate microwave signals, pulses, DC signals (e.g., currents/voltages) based on external analog/digital signals fed to the input ports of the board and/or analog/digital control signals coming from a classical processing unit 970 bidirectionally coupled to the synthesizer unit 960. This unit includes the functionality of a digital-to-analog converter (DAC). In various embodiments, the synthesizer can be implemented using RSFQ or ERSFQ technologies. The DC signals generated by this unit can be used to flux-bias various microwave components (that may be on a PCB) such as tunable qubits, tunable couplers, Josephson isolators, JDAs etc.

The microwave signals generated by the synthesizer unit 960 can be control signals such as pumps that power JIS devices, JDAs, microwave/optical links, Josephson circulators, up-conversion and/or down-conversion unit, etc. Other microwave signals generated by the synthesizer unit 960 can be input signals for the quantum chip, such as readout signals, qubit pulses, gate signals (e.g., signals that generate quantum gates between sets of qubits), etc. In some embodiments, the synthesizer unit 960 can also generate periodic signals, such as a clock, and distribute it across the board. Alternatively, or in addition, the synthesizer unit 960 could receive a clock signal externally through the input interfaces/ports.

There is a digitizer unit 950 coupled to an output of the synthesizer unit 960 and operative to sample and digitize the analog readout signals coming out of the quantum chip. The digitizer unit 950 receives an output of a down conversion unit 940 and includes the functionality of an analog-to-digital converter (ADC). This unit receives control signals such as clock from the input ports on the board or from the synthesizer unit 960. In various embodiments, the digitizer unit 950 can be implemented using RSFQ or ERSFQ technologies.

There is a classical processing unit 970 bidirectionally coupled to the synthesizer unit 960. The classical processing unit 970 combines logic and memory circuits and is operative to process the measurement results of one or more quantum chips 540 and 740 in real-time, and/or control the quantum chip and the various board components in real-time and/or store and run certain subroutines on the quantum processor, communicated to it through the input ports or interfaces, such as input interface 980. In one embodiment, the classical processing unit 970 is within the cryogenic environment and configured to realize quantum feedback (i.e., perform conditional operations on the quantum processor and the various components of the architecture based on the received and analyzed measurement results and the algorithm state), and/or communicate results and programs with a higher-layer electronics residing at a higher-temperature stage, such as the 4 K stage of the dilution refrigerator or room temperature stage (outside the fridge) via the input and output ports/interfaces, such as input interface 980 and output interface 990. In various embodiments, the classical processing unit can be implemented using RSFQ, ERSFQ, and/or cryogenic field programmable gate array (FPGA) technologies.

Figure 9:
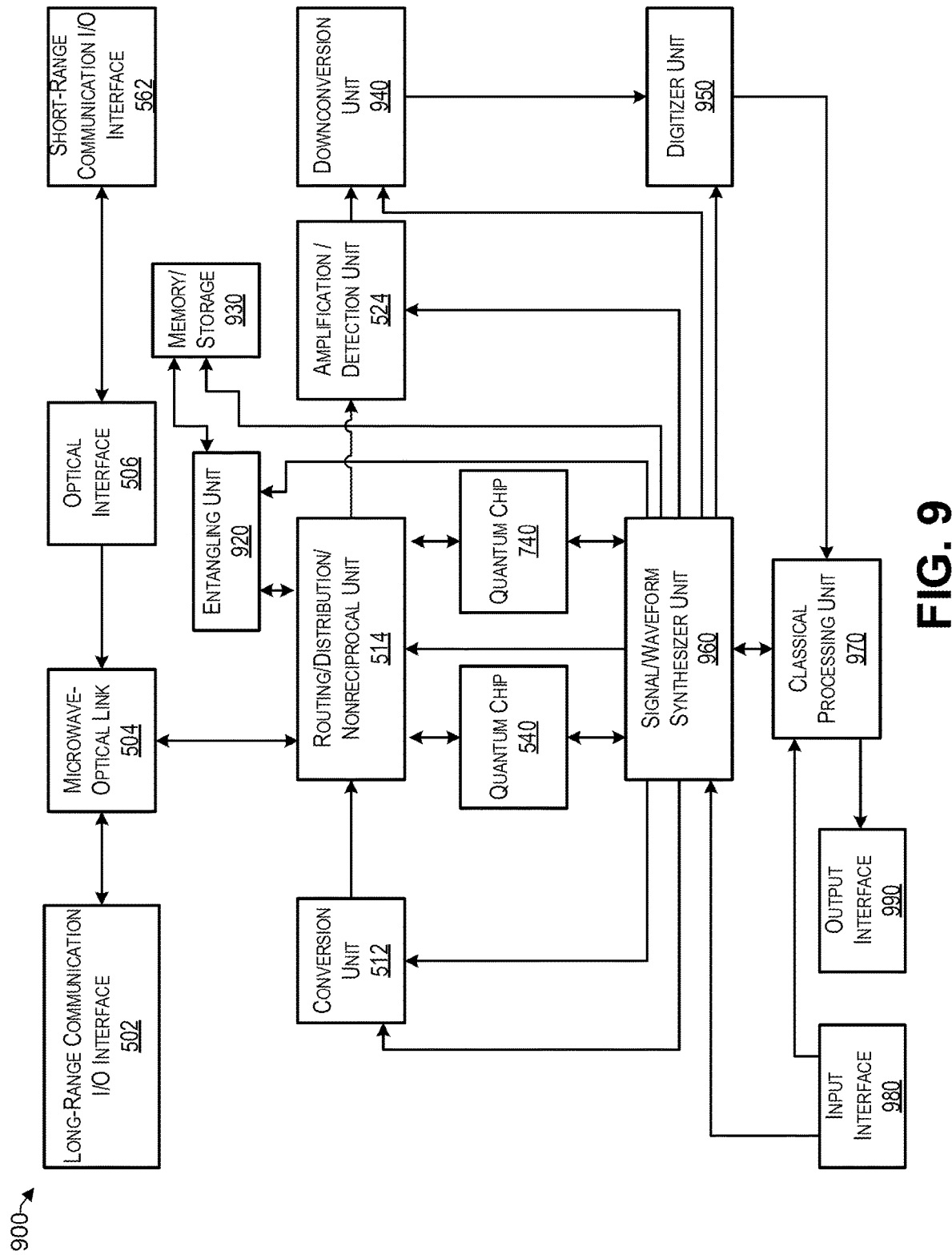
FIG. 9 is a conceptual block diagram of a quantum architecture with embedded classical processing and control, consistent with an illustrative embodiment.
Figure 10:
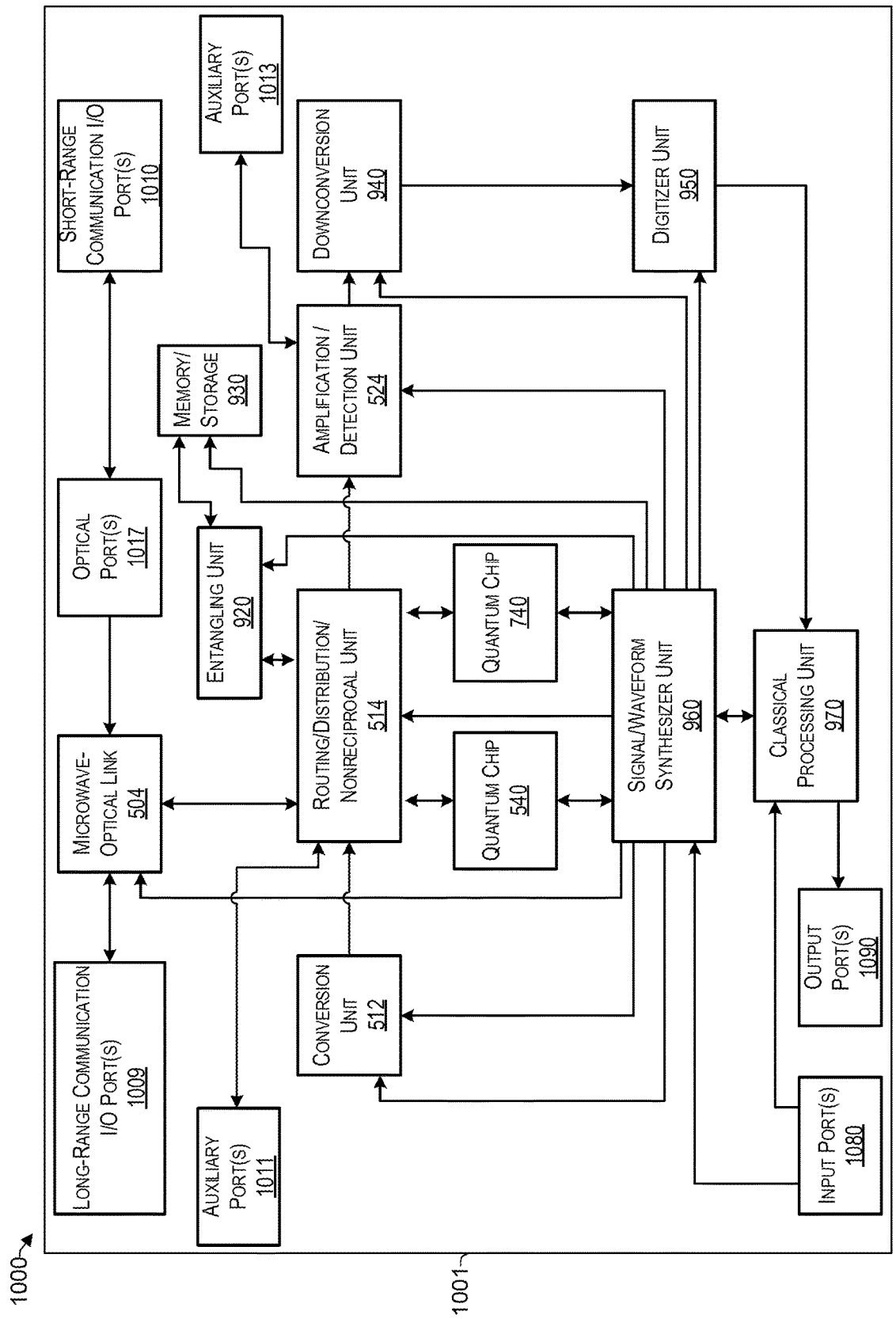
FIG. 10 is a conceptual block diagram of a hybrid architecture with embedded classical processing and control on a platform, consistent with an illustrative embodiment.

FIG. 10 is a conceptual block diagram of a hybrid architecture 1000 with embedded classical processing and control in a multi-chip module configuration, consistent with an illustrative embodiment. Architecture 1000 represents an arrangement of components on a platform such as (e.g., multi-layer) printed circuit board (PCB) board or a laminate substrate 1001. Many of the components of FIG. 10 were discussed in the context of previous figures, and therefore not repeated here for brevity. In addition to being on a multilayer platform 1001, a salient difference in architecture 1000 is that includes various additional auxiliary ports, such as port 1011 and 1013 coupled to the quantum signal unit 514 and amplification/detection unit 524, respectively. Further, instead of the interfaces of FIG. 9, the architecture 1000 of FIG. 10 includes ports (e.g., 1009, 1017, 1010, 1013, 1090, and 1080).

In various embodiments, the platform (e.g., PCB) 1001 can be positioned horizontally in a dilution refrigerator or vertically. When placed vertically, the classical processing unit 970 can be placed at a top portion (with respect to the bottom of the dilution refrigerator), thereby allowing the classical processing unit 970 to be operated at a temperature (e.g., 4K stage) that is higher than that of the quantum chips 540 and 740 (e.g., 10 mK) while being in the dilution refrigerator. Stated differently, the platform 1001 can cross different thermal stages in the dilution refrigerator.

Example Computer Platform

Figure 11:
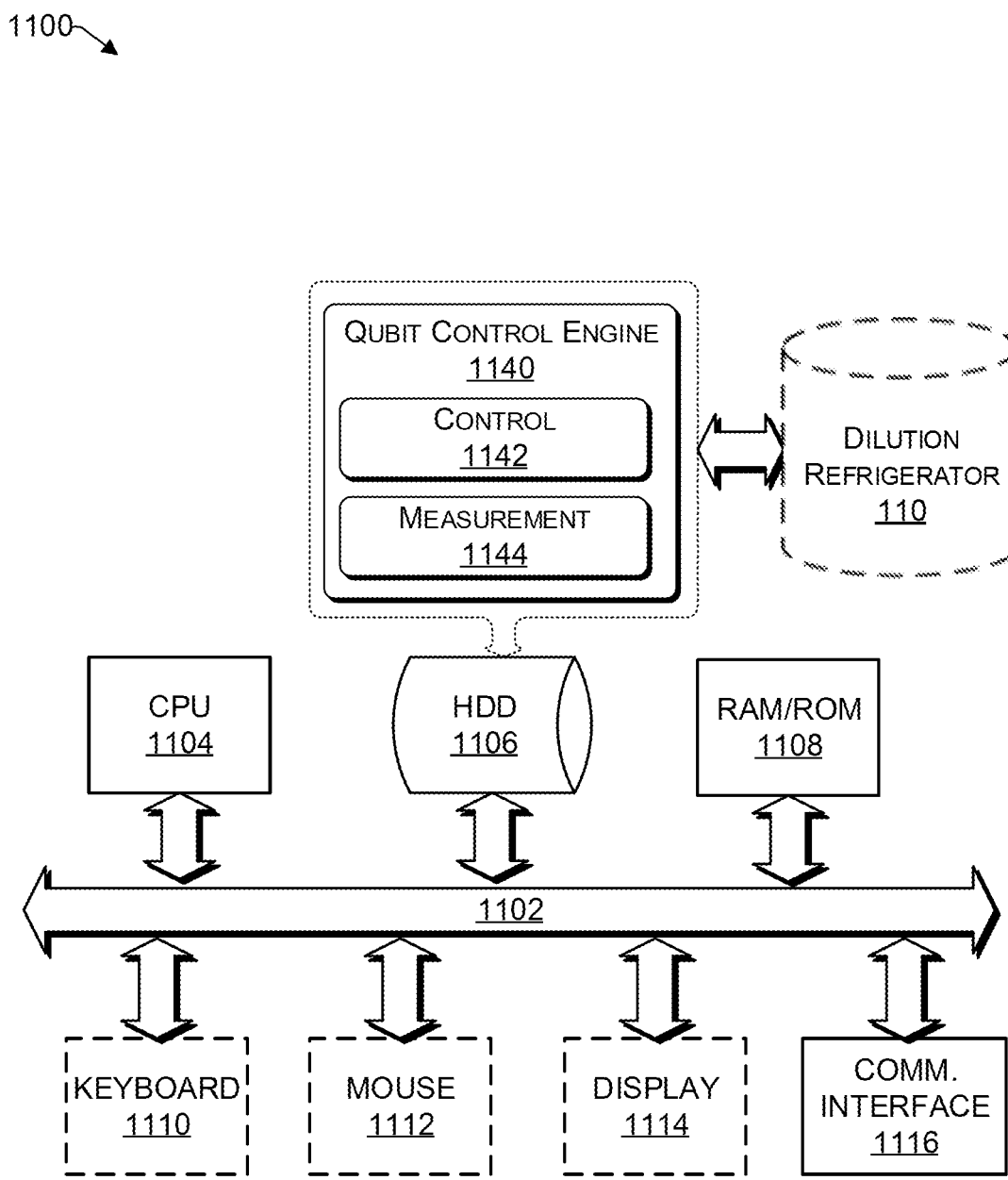
FIG. 11 provides a functional block diagram illustration of a computer hardware platform that can be used to implement a classical computing device.

As discussed above, functions relating to interacting with qubits by way of measurement and control signals may include a measurement and control unit, as shown in FIG. 1, or a classical processing unit, as shown in FIGS. 9 and 10. FIG. 11 provides a functional block diagram illustration of a computer hardware platform 1100 that can be used to implement a particularly configured computing device that can host a qubit control engine 1140. In particular, FIG. 11 illustrates a network or host computer platform 1100, as may be used to implement an appropriately configured computing device, such as the measurement and control block 130 of FIG. 1.

The computer platform 1100 may include a central processing unit (CPU) 1104, a hard disk drive (HDD) 1106, random access memory (RAM) and/or read only memory (ROM) 1108, a keyboard 1110, a mouse 1112, a display 1114, and a communication interface 1116, which are connected to a system bus 1102. In some embodiments (e.g., when operated in a cryogenic environment, one or more components may be not included, such as a keyboard 1110, mouse 1112, display 1114, etc.

In one embodiment, the HDD 1106, has capabilities that include storing a program that can execute various processes, such as the qubit control engine 1140, in a manner described herein. The qubit control engine 1140 may have various modules configured to perform different functions. For example, there may be a control module 1142 that is operative to send control signals to qubits of one or more quantum chips. There may be a measurement module 1144 operative to perform functions to receive feedback from the qubits discussed herein.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A quantum circuit, comprising:
   a quantum signal unit;
   a first quantum chip comprising a plurality of qubit devices coupled to the quantum signal unit; and
   a first quantum entangling unit coupled to the quantum signal unit and configured to generate an entanglement between a first and a second qubit device on the first quantum chip via the quantum signal unit.

2. The quantum circuit of claim 1, further comprising a second quantum chip including a plurality of qubit devices, wherein:
   the second quantum chip is coupled to the quantum signal unit; and
   the first quantum entangling unit is configured to generate an entanglement between the first qubit device on the first quantum chip and a third qubit device on the second quantum chip, via the quantum signal unit.

3. The quantum circuit of claim 1, wherein the first qubit device and the second qubit device of the first quantum chip are not coupled directly.

4. The quantum circuit of claim 1, wherein the first quantum entangling unit comprises a Josephson mixer device.

5. The quantum circuit of claim 1, wherein the first quantum entangling unit comprises a beam splitter device.

6. The quantum circuit of claim 1, wherein the first quantum entangling unit comprises a superconducting transmission line.

7. The quantum circuit of claim 1, wherein the first quantum entangling unit is on a same substrate as the quantum chip.

8. The quantum circuit of claim 1, further comprising a second quantum signal unit bi-directionally coupled to the quantum chip.

9. The quantum circuit of claim 8, further comprising:
   a long-range input-output (I/O) port; and
   a short-range I/O port coupled to the first quantum entangling unit.

10. The quantum circuit of claim 8, wherein the first quantum chip, the first quantum entangling unit, and the quantum signal unit are separate components on a printed circuit board (PCB).

11. The quantum circuit of claim 10, further comprising a second quantum chip bi-directionally coupled between the first quantum signal unit and the second quantum signal unit.

12. The quantum circuit of claim 8, further comprising a second quantum chip bi-directionally coupled between the first quantum signal unit and the second quantum signal unit.

13. The quantum circuit of claim 12, wherein:
   the first quantum chip is in a first cryogenic refrigeration unit; and
   the second quantum chip is in a second cryogenic refrigeration unit that is separate from the first cryogenic refrigeration unit.

14. A quantum circuit, comprising:
   a quantum signal unit;
   a first quantum chip comprising a plurality of qubit devices and coupled to the quantum signal unit;
   a second quantum chip coupled to the first quantum signal unit;
   a first quantum entangling unit coupled to the quantum signal unit;
   a synthesizer unit bidirectionally coupled to the first quantum chip, the second quantum chip, and the first quantum signal unit; and
   a classical processing unit coupled to the synthesizer unit and operative to control the first and second quantum chips.

15. The quantum circuit of claim 14, wherein the second quantum chip, the synthesizer unit, first quantum signal unit, and the first quantum entangling unit are on a same printed circuit board (PCB).

16. The quantum circuit of claim 15, wherein:
   the PCB is vertically anchored in a cryogenic refrigeration unit; and
   the classical processing unit is in a stage of the cryogenic refrigeration unit that is at a higher temperature than the first and second quantum chips.

17. The quantum circuit of claim 15, further comprising:
   a first auxiliary port coupled to the first quantum signal unit;
   an amplification or detection unit coupled to an output of the first quantum signal unit; and
   a second auxiliary port coupled to the amplification or detection unit.

18. The quantum circuit of claim 14, wherein the first quantum entangling unit is configured to generate an entanglement between a first and a second qubit device on the first quantum chip.

19. The quantum circuit of claim 18, wherein the first quantum entangling unit is configured to generate an entanglement between a third qubit device on the first quantum chip and a fourth qubit device on the second quantum chip.

20. The quantum circuit of claim 18, wherein the first qubit device and the second qubit device of the first quantum chip are not directly coupled.

\* \* \* \* \*